United States Patent
Kimura et al.

(10) Patent No.: US 7,179,666 B2
(45) Date of Patent: Feb. 20, 2007

(54) METHOD FOR MANUFACTURING AN ELECTRONIC CIRCUIT DEVICE AND ELECTRONIC CIRCUIT DEVICE

(75) Inventors: Yuji Kimura, Otsu (JP); Takenobu Maeda, Omihachiman (JP); Toru Kabe, Koka-gun (JP)

(73) Assignee: Murata Manufacturing Co., Ltd. (JP)

( * ) Notice: Subject to any disclaimer, the term of this patent is extended or adjusted under 35 U.S.C. 154(b) by 228 days.

(21) Appl. No.: 10/901,750

(22) Filed: Jul. 29, 2004

(65) Prior Publication Data

US 2005/0064627 A1  Mar. 24, 2005

(30) Foreign Application Priority Data

Sep. 19, 2003  (JP) ............................ 2003-327055

(51) Int. Cl.
*H01L 21/58* (2006.01)
(52) U.S. Cl. ................. 438/15; 438/108; 257/E23.179
(58) Field of Classification Search ................. 438/15, 438/108, 614, FOR. 369; 257/E23.179
See application file for complete search history.

(56) References Cited

U.S. PATENT DOCUMENTS

| | | | |
|---|---|---|---|
| 5,347,428 A | * | 9/1994 | Carson et al. .............. 361/760 |
| 6,214,642 B1 | * | 4/2001 | Chen et al. .................. 438/108 |
| 6,593,168 B1 | * | 7/2003 | Ehrichs et al. .............. 438/108 |
| 6,981,317 B1 | * | 1/2006 | Nishida ....................... 29/840 |
| 2003/0186486 A1 | * | 10/2003 | Swan et al. ................. 438/125 |

FOREIGN PATENT DOCUMENTS

| | | |
|---|---|---|
| CN | 1034463 | 8/1989 |
| JP | 09-181098 | 7/1997 |
| JP | 9-321086 | 12/1997 |
| JP | 2002-009347 | 1/2002 |

* cited by examiner

*Primary Examiner*—George Fourson
(74) *Attorney, Agent, or Firm*—Ostrolenk, Faber, Gerb & Soffen, LLP

(57) ABSTRACT

A circuit element having electrodes on one main surface thereof and a substrate having connection bump electrodes and recognition bump electrodes provided on one main surface thereof are prepared. Connection bumps and recognition bumps are formed on the connection bump electrodes and the recognition bump electrodes by using a wire bonding method. Based on the images of the recognition bumps picked up by an optical device, the location of the recognition bumps is detected and, based on the detected location, the circuit element is connected to the substrate through the connection bumps. Since the upper portions of the recognition bumps are in a convex shape, a contrast with respect to the recognition bump electrodes is easily obtained and the location of the recognition bumps can be correctly detected.

18 Claims, 7 Drawing Sheets

RECOGNITION BUMP

CONNECTION BUMP

RECOGNITION PATTERN

REGISTERED RECOGNITION PATTERN

METHOD FOR MANUFACTURING AN ELECTRONIC CIRCUIT DEVICE AND ELECTRONIC CIRCUIT DEVICE

BACKGROUND OF THE INVENTION

1. Field of the Invention

The present invention relates to a method for manufacturing an electronic circuit device in which a circuit element is connected to a substrate through bumps formed by using a wire bonding method, and to an electronic circuit device.

2. Description of the Related Art

In recent years, for manufacturing high-performance, miniaturized, and low-profile portable telephones, personal computers, etc., a flip chip mounting method using bumps has been increasingly adopted. The bumps are provided either on a substrate or on a chip (circuit element).

According to a known technique, in order to mount the chip on the substrate using the bumps, a part of the wiring pattern of the substrate is registered as a recognition pattern and the relative location between the recognition pattern and the mounting central location is registered to decide the mounting location of the chip. When the chip is mounted on the substrate, in order to realize good electrical conduction, it is desirable to make the centers of the electrodes of the chip agree with the centers of the connection bumps.

However, when a sintered ceramic substrate or a resin substrate is used as the substrate, since the accuracy for forming the wiring pattern is about ±30 µm, this technique of determining the mounting location of the chip with reference to the wiring pattern causes spatial displacement between the chip electrodes and the connection bumps.

Japanese Unexamined Patent Application Publication No. 9-181098 proposes a semiconductor device in which connection bumps are formed on electrodes of a substrate by a wire bonding method, a chip is mounted through these connection bumps, recognition marks are formed outside the chip mounting location of the substrate at two locations on a diagonal line with respect to the chip, and the spatial relation between the substrate and the chip is recognized through the recognition marks to mount the chip.

However, the above recognition marks are formed by coating ink, for example, on the substrate. That is, the recognition marks and the connection bumps are formed by quite different processes. The connection bumps are not always formed at fixed locations of the electrodes of the substrate, and some displacement may occur. Accordingly, the relative location between the recognition marks and the connection bumps varies and, even if the chip is mounted with reference to the recognition marks, spatial displacement between the centers of the electrodes of the chip and the centers of the connection bumps cannot be reduced.

Japanese Unexamined Patent Application Publication No. 2002-9347 proposes a technique in which recognition bumps and connection bumps are simultaneously formed on electrodes of a substrate by a plating method and the recognition bumps are registered as a recognition pattern to decide the location for mounting a chip. In this case, the accuracy for forming bumps is about ±5 µm and, since this is more accurate than the wiring accuracy, there is an advantage in that spatial displacement between the centers of electrodes of the chip and the centers of the connection bumps can be reduced.

To perform image recognition of the recognition bumps, light is applied to the substrate from a light source, the reflected light from the substrate is captured by a camera, and a contrast of the recognition object can be obtained by representing the intensity of the reflected light in binary or multilevel fashion. Here, the light applied to the substrate is vertical light applied by epi-illumination or ring illumination, having the same axis as the camera.

But the plated bumps have a substantially flat upper surface. When plated bumps are used as recognition bumps, the reflected light from the upper surface has the same intensity as the reflected light from the recognition bump electrodes. Therefore, even if the reflected light picked up by the camera is represented in binary form, no contrast can be obtained between the recognition bumps and the recognition bump electrodes, which causes a problem in that the location of the recognition bumps cannot be accurately detected.

SUMMARY OF THE INVENTION

Responding to the foregoing problems, the present invention provides a method for manufacturing an electronic circuit device in which spatial displacement between the centers of electrodes of a chip and the centers of connection bumps is reduced by increasing the accuracy for forming the bumps, whereby, when image recognition of recognition bumps is performed, a contrast is easily obtained. The invention is further directed to an electronic circuit device manufactured by the method.

According to a first aspect of the present invention, a method for manufacturing an electronic circuit device comprises the steps of preparing a circuit element having electrodes on one main surface thereof and a substrate having connection bump electrodes and recognition bump electrodes provided on one main surface thereof; forming connection bumps and recognition bumps on the connection bump electrodes and the recognition bump electrodes, respectively, by using a wire bonding method, preferably continuously; detecting the location of the recognition bumps, based on the images of the recognition bumps picked up by using an optical device; and connecting the circuit element to the substrate through the connection bumps, based on the detected location of the recognition bumps.

One characteristic of the present invention is that the connection bumps and the recognition bumps are formed by a wire bonding method and the recognition bumps are used as a recognition pattern for deciding the mounting location of the circuit element. The connection bumps and the recognition bumps are preferably continuously formed. The meaning of "continuously" is to form the connection bumps and the recognition bumps at one time by recognition of the substrate pattern. The sequence for forming the connection bumps and the recognition bumps may be alternated. Bumps (for example, recognition bumps) of one type may all be formed and then, bumps (for example, connection bumps) of another type may be formed. When the bumps are continuously formed, the accuracy for forming bumps is about ±10 µm and is high when compared with the case when a sintered ceramic substrate and a resin substrate are used as a substrate, wherein the accuracy for forming wiring patterns is ±30 µm. As a result, spatial displacement between the centers of electrodes of the chip and the centers of connection bumps can be reduced.

Another characteristic of the present invention is that the shape of the recognition bumps used for spatial recognition is different from the shape of plated bumps and in particular, the upper surface is not flat. In the case of a plated bump as shown in FIG. 1A, when both the bump and the electrode are made of a metal and their upper surface is flat, even if the materials constituting those are different from each other, reflected light having the same intensity is returned to the optical device due to the metallic luster. Therefore, there is a low contrast. On the other hand, with wire bumps, as is well known, an initial ball is formed by generating a spark at the tip of a metal wire (for example, gold wire) and, after the ball has been connected to the electrode, a bump is formed by pulling the wire off. Therefore, as shown in FIG. 1B, the upper portion of the recognition bump is in a convex shape and vertical light from an optical device is reflected diffusely at the upper portion of the bump. Accordingly, the reflected light from the recognition bump to the optical device is weaker than the reflected light from the recognition bump electrode and, as a result, the contrast between them is strong. The location of the recognition bump can be correctly recognized by processing the reflected light picked up by the optical device to produce a binary or multilevel representation. That is, a circuit element can be accurately and correctly mounted on a substrate.

In the present invention, it is desirable that the recognition bump electrode have a sufficient width such that, when an image of the recognition bump is picked up by using the optical device, the edge portion of the recognition bump electrode is not included in an area which is registered as a recognition pattern. This is to reduce the risk of the end portion (edge portion) of the recognition bump being wrongly recognized as the end portion of the recognition bump electrode.

Moreover, the connection bump electrode may have substantially the same width as the connection bump. When an image of the connection bump is picked up, since an image of the end portion of the connection bump electrode is also picked up at the same time, there is no risk of the connection bump being wrongly recognized as the recognition bump. Furthermore, since the connection bump electrodes can be formed so as to have a narrow spacing, the size of the circuit element and the substrate can be reduced.

In the present invention, the recognition bump electrode and the registered recognition pattern are geometrically substantially similar. When the distance from the center of the connection bump in the connection bump electrode to the edge portion, closest to the connection bump, of the connection bump electrode is $L_1$, the diameter of the connection bump is $d_1$, the distance from the center of the recognition bump in the recognition bump electrode to the edge portion, closest to the recognition bump, of the recognition bump electrode is $L_2$, the diameter of the recognition bump is $d_2$, the diameter of a contrast region of the recognition bump in the registered recognition pattern is $d_0$, the width of the registered recognition pattern is $2L_0$, the accuracy for making bumps is $\pm\delta$, and the magnification of the optical device when an image is picked up is $\alpha$, it is desirable that the following relation hold:

$$\alpha(L_1-d_1/2-\delta)<L_0-d_0/2<\alpha(L_2-d_2/2-\delta).$$

FIG. 2A shows a recognition bump electrode E2 and a recognition bump B2, FIG. 2B shows a connection bump electrode E1 and a connection bump B1, and FIG. 2C shows a registered recognition pattern. As shown in FIGS. 2A to 2C, when the distances to the edge portions closest to the centers of the bumps are $L_1$ and $L_2$, the contrast B0 of the bump is set at the center of the registered area E0 in the recognition pattern, and, when the displacement for forming the bumps is $\delta$, the shortest distance from the outer diameter of the bumps to the end portion of the electrodes is expressed as follows.

$$D_1=L_1-d_1/2-\delta$$

$$D_2=L_2-d_2/2-\delta$$

Moreover, $D_1$ is the shortest defined distance for the connection bump B1 and $D_2$ is the shortest defined distance for the recognition bump B2. In the recognition pattern, the shortest distance from the outer diameter of the bump (contrast B0) to the end portion of the registered area E0 is $$D_0=L_0-d_0/2.$$

When the magnification of the camera at the time when an image of the recognition pattern is picked up is $\alpha$, it is desirable that the following formula be valid:

$$\alpha D_1<D_0<\alpha D_2.$$

As described above, when the sizes of bumps, the widths of electrodes, and the sizes of recognition patterns are set, the end portions of electrodes are not included in the recognition pattern, and degradation of the agreement due to spatial displacement of the bumps can be prevented.

In the present invention, the diameter of the recognition bumps may be made larger than the diameter of the connection bumps. Even when the recognition bumps and the connection bumps are formed so as to be close to each other in order to make the circuit element and the substrate smaller, the risk that the connection bumps are wrongly recognized as recognition bumps is further reduced by making the recognition bumps larger than the connection bumps. Moreover, it is desirable that the recognition bumps be made at least 1.5 times larger than the connection bumps.

In the present invention, it is desirable that the recognition bumps be provided outside the area where the circuit element is mounted and at two or more locations on a diagonal line with respect to the circuit element. Since the connection bumps are formed along the outer edge of the circuit element, and since the recognition bumps are formed outside the connection bumps, when the circuit element is mounted on the substrate, interference between the circuit element and the recognition bumps can be prevented and there is no effect on the connection of the circuit element. Furthermore, since the recognition bumps are provided on a diagonal line with respect to the circuit element, angular correction, particularly the angular correction of a small circuit element, improves in accuracy.

In the present invention, it is desirable that both the step of forming the connection bumps and the recognition bumps, and the step of connecting the circuit element to the substrate through the connecting bumps, each be performed while the substrate is substantially at the same temperature. The thermal expansion of the substrate when the bumps are formed is repeated when the chip is mounted and, as a result, spatial displacement between the connection bumps and the chip electrodes can be reduced.

In the present invention, when an electronic circuit device is manufactured by using a manufacturing method according to the present invention, spatial displacement between the connection bumps and the chip electrodes is reduced, conductive failure between the substrate and the circuit element is avoided, and an electronic circuit device having high reliability can be produced.

According to the present invention, when the connection bumps and the recognition bumps are continuously formed by a wire bonding method and the recognition bumps are used as a recognition pattern to decide the mounting location of a circuit element, the accuracy for forming bumps is improved and spatial displacement between the centers of electrodes of the chip and the centers of connection bumps can be reduced. Furthermore, since the recognition bumps used for spatial recognition are formed by a wire bonding method, a contrast between the recognition bumps and the recognition bump electrodes can be easily obtained at image recognition and the location of the recognition bumps can be correctly recognized. Therefore, a circuit element can be accurately and correctly mounted on a substrate.

Other features and advantages of the present invention will become apparent from the following description of embodiments of the invention which refers to the accompanying drawings.

DESCRIPTION OF EMBODIMENTS OF THE INVENTION

Hereinafter, the present invention is described with reference to an embodiment.

Figure 3:
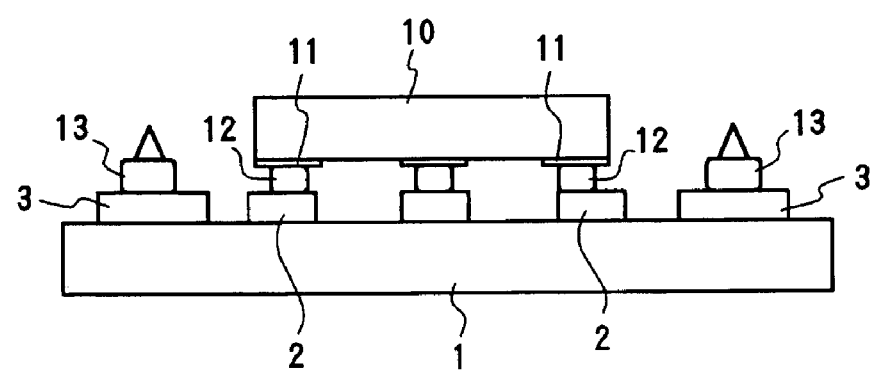
FIG. 3 is a sectional view of a first embodiment of an electronic circuit device manufactured by a manufacturing method according to the present invention.
Figure 4:
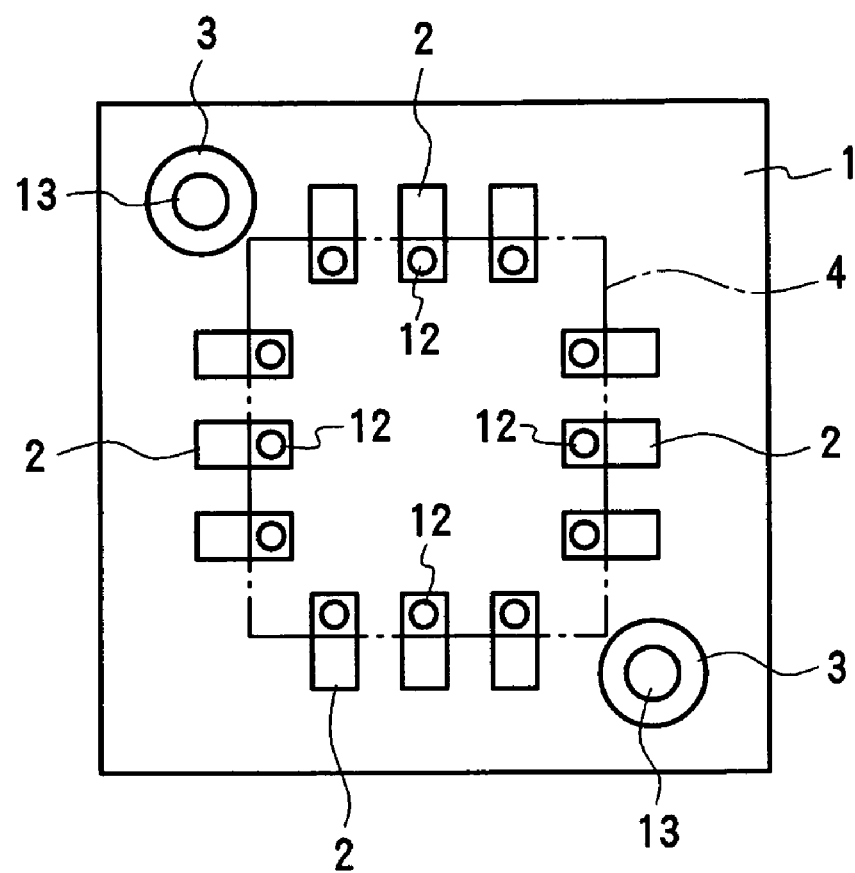
FIG. 4 is a top view of the substrate of the electronic circuit device shown in FIG. 3.

FIGS. 3 and 4 show an embodiment of an electronic circuit device manufactured by a manufacturing method according to the present invention. In the electronic circuit device, a substrate 1 having connection bump electrodes 2 and recognition bump electrodes 3 on one main surface (upper main surface) thereof and a chip (circuit element) 10 having chip electrodes 11 on one main surface (lower main surface) thereof are provided, and the electrodes 11 of the chip 10 are connected to the connection bump electrodes 2 through connection bumps 12. Furthermore, recognition bumps 13 are fixed to the recognition bump electrodes 3.

The substrate 1 is composed of a resin substrate such as a glass epoxy resin, etc., or a sintered substrate made of alumina, etc. On the upper surface of the substrate 1, a plurality of connection bump electrodes 2 are formed along the outer edge of a chip mounting location, and recognition bump electrodes 3 are formed outside the chip mounting location and at two locations along a diagonal line of the chip mounting location. These electrodes 2 and 3 may have a multilayer structure of, for example, Au/Ni/Cu or a single layer structure. The material does not matter. The wiring width of the connection bump electrodes 2 is in the range of about 80 to 120 µm and the wiring thickness is in the range of about 15 to 50 µm. The accuracy in the width direction in forming the wiring pattern is about ±30 µm. The wiring width of the recognition bump electrodes 3 is made about 2 to 10 times as large as the diameter of the recognition bumps 13. When not much reduction of the mounting area is required, the width may be set to be 10 times or more as large. Here, although the recognition bump electrodes 3 are circular, they may be made square. The wiring thickness of the recognition bump electrodes 3 is about the same as that of the connection bump electrodes 2. In order to increase the productivity, a plurality of the same patterns of connection bump electrodes 2 and recognition bump electrodes 3 are formed on the substrate 1 and divided after chips have been mounted. Moreover, although not illustrated, there are cases in which other electrodes may be provided in order to mount surface-mounting parts on the substrate 1.

The chip 10 may be a semiconductor element made of, for example, Si, GaAs, etc., or a surface acoustic wave element made of $LiTaO_3$, $LiNbO_3$, quartz, etc., for example. One side of the chip is about 1 to 3 mm. The chip electrodes are made of Al, Au, etc., and the thickness of the electrodes is about 1 to 2 µm. The chips are divided in advance.

Figure 5A:
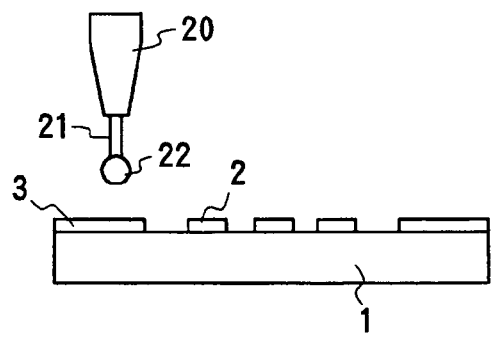
FIGS. 5A to 5E show how bumps are formed by using a wire bonding method.
Figure 5B:
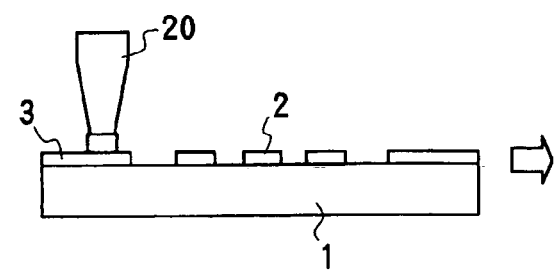

Next, a method for manufacturing an electronic circuit device having the above structure is described with reference to FIGS. 5 to 7.

As shown in FIGS. 5A–5E, a wire bonding method by which the connection bumps 12 and recognition bumps 13 are formed on the electrodes 2 and 3 on the substrate 1 is performed as described below. The material of the bumps is Au, Al, Cu, etc. A wire 21 is led out from the tip of a capillary (wire bonding tool) and the tip of the wire 21 is melted using an electric welding torch (not illustrated) to form a ball 22. The ball diameter is adjustable depending on the bump diameter to be aimed at. The ball diameter is normally about 2 to 3 times as large as the diameter of the wire (about 20 to 30 µm in diameter). The ball diameter can be changed by changing the spark conditions. When the spark conditions (discharge energy, etc.) are increased, the melted length at the tip of the gold wire is lengthened and the ball diameter becomes larger. In addition, the ball diameter can be changed by changing the length of the wire 21 led out from the capillary.

First, pattern recognition of the substrate 1 is performed and the location where the bumps 12 and 13 are to be formed is decided. Next, the recognition bumps 13 are formed. A ball 22 which is large in diameter is formed as shown in FIG. 5A, the capillary 20 is moved above a recognition bump electrode 3 obtained by the pattern recognition, and the ball 22 is pressed down and connected to the electrode 3 by applying a supersonic wave (see FIG. 5B). At this time, it is desirable that the temperature of the substrate 1 be about 25 to 200° C., the pressure weight be about 400 to 1200 mN, the output of the supersonic wave be about 50 to 300 mW, and the time for application of the supersonic wave be about 10 to 50 ms. After the ball 22 has been connected to the electrode 3, the capillary 20 is pulled up, the wire 21 is pulled off and a bump 13 is formed. In particular, since the ball 22 has a large diameter, a recognition bump 13 having a large diameter can be formed. See FIG. 5C.

Figure 5C:
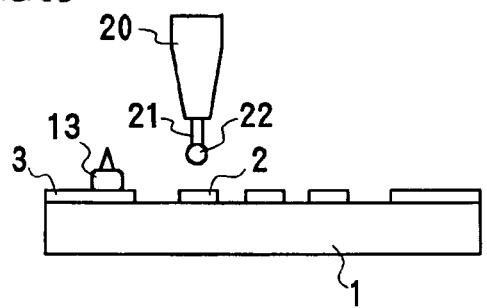
Figure 5D:
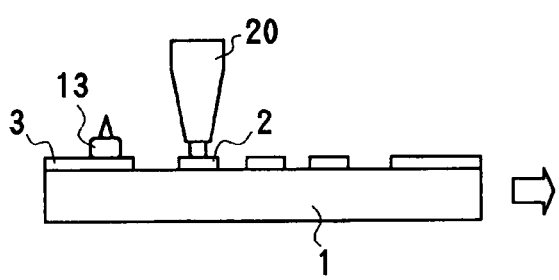
Figure 5E:
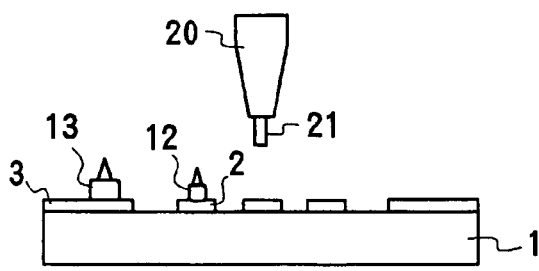
Figure 6:
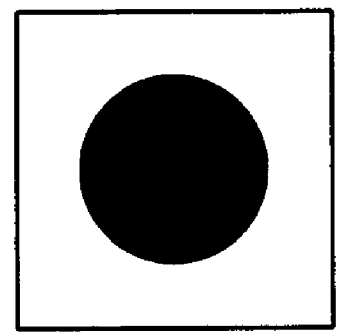
FIG. 6 shows a recognition pattern of a recognition bump.

Next, the capillary 20 or the substrate 1 is horizontally moved a fixed distance, as shown in FIG. 5C, a ball 22 having a small diameter is formed at the tip of the wire 21, and the ball 22 is connected to a connection bump electrode 2 to form a connection bump 12 of small diameter (see FIGS. 5D and 5E). The accuracy for forming the bump is about ±10 µm.

In order to prevent incorrect recognition in the image recognition step to be described later, it is desirable that the diameter of the recognition bump 13 be at least 1.5 times as large as the diameter of the connection bump 12. Here, the diameter of the connection bump 12 is made 60 to 120 µm and the diameter of the recognition bump 13 is made 90 to 180 µm. The number of connection bumps is about 6 to 100 per chip.

Next, in order to decide the mounting location of a chip on the substrate 1, a recognition pattern and the relation between the recognition pattern and the mounting central location are registered in advance. First, an area for registration is decided. The area for registration is set to be one to three times as large as the diameter of the recognition bump 13. Next, a recognition pattern shown in FIG. 6 is registered by using a recognition bump 13 which is already formed. The recognition pattern is registered as a binary image or a multilevel image, and the recognition bump 13 and the recognition bump electrode 3 are registered so as to have different contrasts. At this time, the end portion of the recognition bump electrode 3 is not included in the registered recognition pattern. Normally, the recognition patterns at two or more locations are registered. In order to improve the accuracy of angular correction, it is desirable to register two recognition bumps 13 along a substantially diagonal line with respect to the chip 10. However, when no angular correction is needed, only one recognition pattern may be provided. Next, the relative location between the recognition bump 13 and the mounting central location is registered. Also regarding the chip 10, in the same way, a recognition pattern and the relation between the recognition pattern and the mounting central location to be registered are registered. In the case of the chip 10, characteristic locations such as electrodes, etc., may be used as the recognition pattern.

Figure 7A:
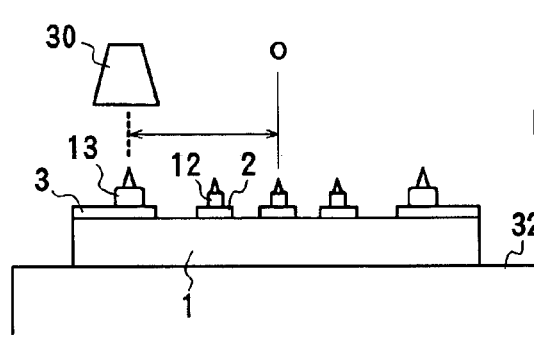
FIGS. 7A and 7B show a spatial recognition process and a mounting process.

Next, a recognition and mounting method is described with reference to FIGS. 7A and 7B. The substrate 1 is transported to a mounting stage 32 by a transporting device and fixed by suction or by any suitable mechanical way. A camera 30 for observing substrates is provided above the mounting stage 32 and the image of the mounting location is picked up by the camera 30 (see FIG. 7A). In the area whose image is picked up, the location close to the recognition pattern registered in advance is detected. Since the recognition bump 13 is formed by a wire bonding method, the upper portion of the recognition bump 13 is in a convex shape. Thus, since the upper surface of the recognition bump electrode 3 is flat, a clear contrast between the recognition bump 13 and the recognition bump electrode 3 can be obtained in the image picked up by the camera 30. Therefore, the location of the recognition bump 13 can be correctly detected.

Figure 1A:
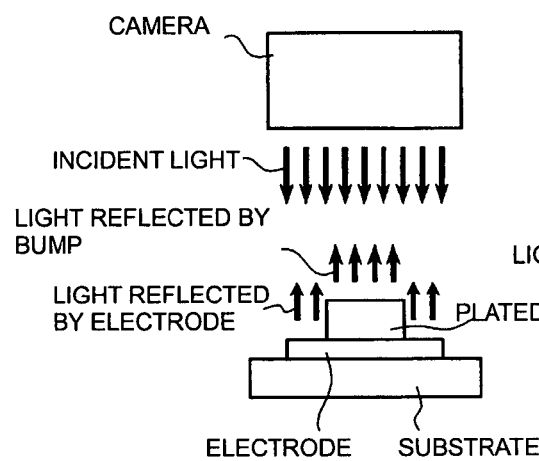
FIGS. 1A and 1B show the difference between image recognition of a plated bump and image recognition of a wire bump.
Figure 1B:
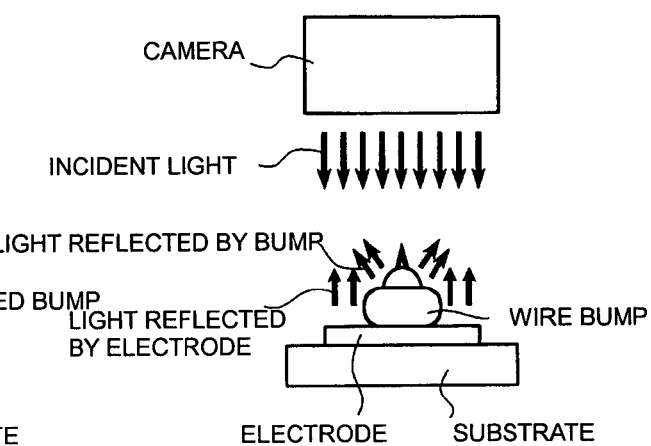
Figure 2A:
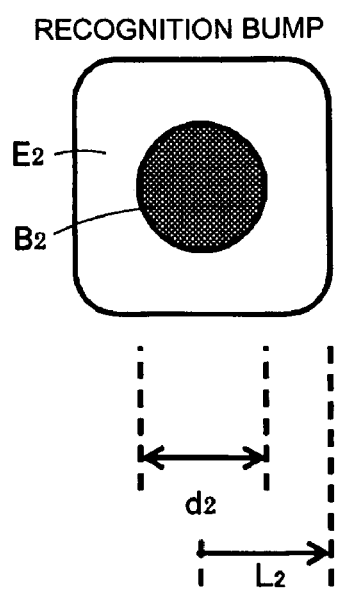
FIGS. 2A to 2C show how the sizes of bumps, electrodes, and a recognition pattern are set.
Figure 2B:
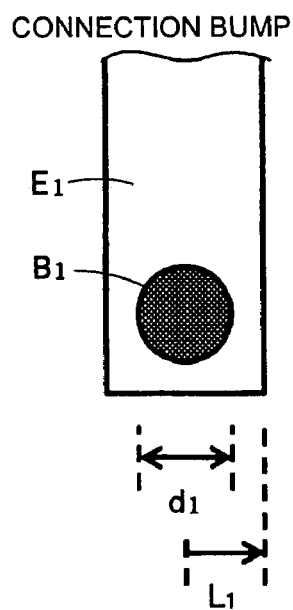
Figure 2C:
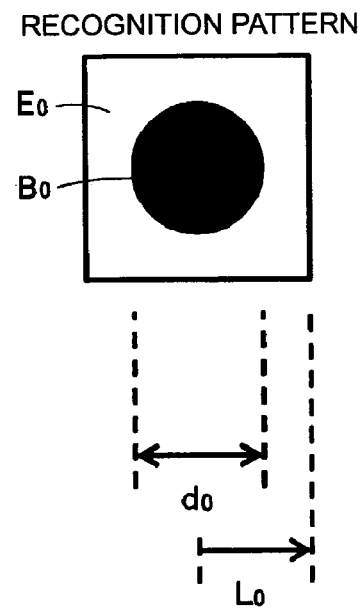

In the recognition pattern, so as not to include the end portion of the recognition bump electrode 3, the recognition bump electrode 3 is made larger than the connection bump electrode 2. Here, the size of the bumps, the electrodes, and the recognition patterns is decided based on the calculating formula described in accordance with FIGS. 2A–2C. Since the end portion of the electrodes is not included in the recognition pattern in this way, there is no degradation of the rate of agreement due to displacement of the bumps. Table 1 shows the relation between displacement of the recognition bumps and the rate of agreement. Moreover, both the connection bumps and recognition bumps were made 100 μm in diameter.

TABLE 1

Relation between displacement of the bumps and the rate of agreement

| Displacement of bumps (μm) | 5 | 10 | 20 | 30 | ... | 80 |
|---|---|---|---|---|---|---|
| Wiring width of connection bump electrodes: 100 μm Wiring width of recognition bump electrodes: 100 μm | 88% | 75% | 50% | — | ... | — |
| Wiring width of connection bump electrodes: 100 μm Wiring width of recognition bump electrodes: 500 μm | 90% | 90% | 90% | 90% | ... | 89% |

(Both the connection bumps and recognition bumps were made 100 μm in diameter.)

As is clearly understood from Table 1, when both the wiring width of the connection bump electrodes 2 and the wiring width of the recognition electrodes 3 are made 100 μm, the rate of agreement when the location for forming the recognition bumps 13 is displaced 20 μm decreases to 50%. On the other hand, when the wiring width of the connection bump electrodes 2 is made 100 μm and the wiring width of the recognition electrodes 3 is made 500 μm, even if the location for forming the recognition bumps 13 is displaced 80 μm, the rate of agreement decreases only to 89%. Therefore, incorrect recognition can be prevented.

The mounting center O on the substrate is decided based on the detected location of the recognition bumps 13 and the spatial relation between the recognition pattern and the mounting center which is registered in advance. Regarding the chip 10, the center of the chip is decided in the same way. The center of each connection bump 12 agrees with the center of each chip electrode 11 as a result of performing spatial correction so that the mounting center O decided based on the recognition bump 13 may agree with the chip center.

Figure 7B:
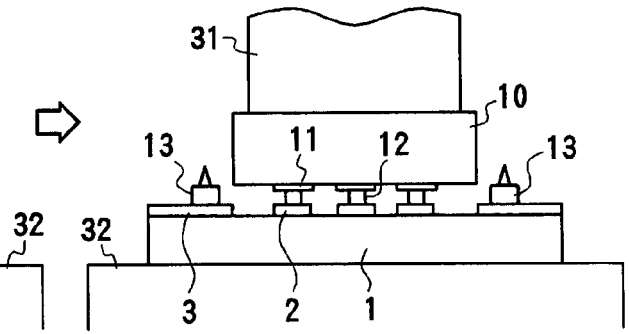

After the spatial correction, the chip 10 is mounted on the substrate 1 by using a flip chip bonder 31, as shown in FIG. 7B. The mounting accuracy is about ±15 μm. At this time, the substrate 1 is heated so as to range from about room temperature to 200° C., the chip 10 is heated to a temperature between room temperature and 300° C., and a pressure of 0.5 to 2 N/bump is applied to the chip 10. A supersonic wave may be applied to the chip 10 during the mounting. In particular, it is desirable that the substrate temperature when the chip 10 is mounted be substantially equal to the substrate temperature at the time when the bumps 12 and 13 were formed. In that case, the thermal expansion of the substrate at the time when the bumps are formed is repeated at the time when the chip is mounted, so that the spatial displacement between the connection bumps of the substrate 1 and the electrodes 11 of the chip 10 can be minimized.

When the chip 10 is mounted on the substrate 1 in the process described above, since the recognition bump 13 formed by a wire bonding method is used as a recognition pattern for deciding the mounting location for the chip 10, the center of the chip electrode 11 can be made to correctly agree with the center of the connection bump 2 and, when compared with the case where the wiring pattern of the substrate is used as a recognition pattern, spatial displacement can be reduced.

In the above embodiment, although when the size of the recognition bumps is made larger than the size of the connection bumps, the risk of wrong recognition of the connection bumps is low, the recognition bumps may also be made as small as the connection bumps. Furthermore, the risk of wrong recognition may be reduced even when the recognition bumps are made smaller than the connection bumps.

In the present embodiment, although the recognition bumps are formed outside the connection bumps and along a diagonal line with respect to the circuit element, they are not limited to locations along a diagonal line. The accuracy of angular correction is improved and the interference between the recognition bumps and the chip can be prevented when the chip is mounted when the recognition bumps are formed outside the connection bumps. Moreover, the recognition bumps may also be formed inside the connection bumps; that is, the recognition bumps may be formed within the region where the chip is mounted. In this case, since the area needed for forming the bumps can be made smaller, it contributes to reduction of the mounting area. However, it is desirable to make the recognition bumps lower than the connection bumps so that, when the chip is mounted, there may be no interaction between the recognition bumps and the chip.

The shape of the recognition bump electrodes may be of any form such as a square, a rectangle, etc., besides the circular form as in the present embodiment. Furthermore, the recognition bump electrodes are not limited to island-shaped electrodes, but may be pattern-connected to any one of the connection bump electrodes and other electrodes.

Although the present invention has been described in relation to particular embodiments thereof, many other variations and modifications and other uses will become apparent to those skilled in the art. Therefore, the present invention is not limited by the specific disclosure herein.

What is claimed is:

1. A method for manufacturing an electronic circuit device, comprising the steps of:
   preparing a circuit element having electrodes on one main surface thereof and preparing a substrate having connection bump electrodes and recognition bump electrodes on one main surface thereof;
   forming connection bumps and recognition bumps on the connection bump electrodes and the recognition bump electrodes, respectively, by wire bonding;
   detecting the locations of the recognition bumps, based on images of the recognition bumps picked up by an optical device; and
   connecting the circuit element to the substrate through the connection bumps, based on the detected locations of the recognition bumps.

2. A method for manufacturing an electronic circuit device as claimed in claim 1, wherein said forming step is performed continuously.

3. A method for manufacturing an electronic circuit device as claimed in claim 1, further comprising the steps of:
   registering a recognition pattern for said substrate corresponding to an image of a recognition bump; and
   registering a relation between said recognition pattern for said substrate and a central mounting location on the substrate.

4. A method for manufacturing an electronic circuit device as claimed in claim 3, further comprising the steps of:
   registering a recognition pattern for said circuit element; and
   registering a relation between said recognition pattern for said circuit element and a central mounting location on the circuit element.

5. A method for manufacturing an electronic circuit device as claimed in claim 1, further comprising the steps of:
   registering a recognition pattern for said circuit element; and
   registering a relation between said recognition pattern for said circuit element and a central mounting location on the circuit element.

6. A method for manufacturing an electronic circuit device as claimed in claim 1, wherein said connection bumps are all formed before said recognition bumps are formed.

7. A method for manufacturing an electronic circuit device as claimed in claim 1, wherein said recognition bumps are all formed before said connection bumps are formed.

8. A method for manufacturing an electronic circuit device as claimed in claim 1, wherein the recognition bump electrodes have a sufficient width such that, when images of the recognition bump are picked up by the optical device, the edge portion of the recognition bump electrodes is not included in an area which is registered as a recognition pattern.

9. A method for manufacturing an electronic circuit device as claimed in claim 1, wherein said recognition bump electrodes are larger than said connection bump electrodes.

10. A method for manufacturing an electronic circuit device as claimed in claim 1, wherein said connection bump electrodes have substantially the same width as said connection bumps.

11. A method for manufacturing an electronic circuit device as claimed in claim 1, wherein the recognition bump electrodes and a registered recognition pattern are geometrically substantially similar and, when the distance from the center of the connection bumps in the connection bump electrodes to the edge portion, closest to the connection bumps, of the connection bump electrodes is $L_1$, the diameter of the connection bumps is $d_1$, the distance from the center of the recognition bumps in the recognition bump electrodes to the edge portion, closest to the recognition bumps, of the recognition bump electrodes is $L_2$, the diameter of the recognition bumps is $d_2$, the diameter of a contrast region of the recognition bumps in the registered recognition pattern is $d_0$, the width of the registered recognition pattern is $2L_0$, the accuracy for making bumps is $\pm\delta$, and the magnification of the optical device when an image is picked up is $\alpha$, the following relation holds:

$$\alpha(L_1-d_1/2-\delta)<L_0-d_0/2<\alpha(L_2-d_2/2-\delta).$$

12. A method for manufacturing an electronic circuit device as claimed in claim 1, wherein the recognition bump electrodes and the registered recognition pattern are geometrically substantially similar and, when the distance from the center of the connection bumps in the connection bump electrodes to the edge portion, closest to the connection bumps, of the connection bump electrodes is $L_1$, the diameter of the connection bumps is $d_1$, the distance from the center of the recognition bumps in the recognition bump electrodes to the edge portion, closest to the recognition bumps, of the recognition bump electrodes is $L_2$, the diameter of the recognition bumps is $d_2$, the diameter of a contrast region of the recognition bumps in the registered recognition pattern is $d_0$, the width of the registered recognition pattern is $2L_0$, the accuracy for making bumps is $\pm\delta$, and the magnification of the optical means when an image is picked up is $\alpha$, the following relation holds:

$$\alpha D_1<D_0<\alpha D_2,$$

where $$D_1=L_1-d_1/2-\delta$$

$$D_2=L_2-d_2/2-\delta$$

$$D_0=L_0-d_0/2.$$

13. A method for manufacturing an electronic circuit device as claimed in claim 1, wherein the diameter of the recognition bumps is larger than the diameter of the connection bumps.

14. A method for manufacturing an electronic circuit device as claimed in claim 13, wherein said diameter of said recognition bumps is at least 1.5 times as large as that of said connection bumps.

15. A method for manufacturing an electronic circuit device as claimed in claim 1, wherein the recognition bumps are outside the area where the circuit element is mounted and are provided at two or more locations on a diagonal line of the circuit element.

16. A method for manufacturing an electronic circuit device as claimed in claim 1, wherein both the step of forming the connection bumps and the recognition bumps and the step of connecting the circuit element to the substrate through the connecting bumps are each performed while the substrate is substantially at the same temperature.

17. A method for manufacturing an electronic circuit device as claimed in claim 1, wherein said circuit element is a semiconductor element or a SAW element.

18. A method for manufacturing an electronic circuit device as claimed in claim 1, wherein said substrate is a resin substrate or a sintered substrate.

* * * * *